(12) United States Patent
Fuzetti

(10) Patent No.: US 8,008,576 B2
(45) Date of Patent: Aug. 30, 2011

(54) ENERGY DISTRIBUTION SYSTEM

(75) Inventor: Vagner Fuzetti, Bragança Paulista (BR)

(73) Assignee: Tyco Electronics Brasil LTDA, Sao Paulo (BR)

( * ) Notice: Subject to any disclaimer, the term of this patent is extended or adjusted under 35 U.S.C. 154(b) by 509 days.

(21) Appl. No.: 12/279,269

(22) PCT Filed: Feb. 15, 2007

(86) PCT No.: PCT/US2007/004397
§ 371 (c)(1),
(2), (4) Date: Oct. 21, 2008

(87) PCT Pub. No.: WO2007/095394
PCT Pub. Date: Aug. 23, 2007

(65) Prior Publication Data
US 2009/0050344 A1    Feb. 26, 2009

Related U.S. Application Data

(60) Provisional application No. 60/773,389, filed on Feb. 15, 2006.

(51) Int. Cl.
*H02G 3/18* (2006.01)
(52) U.S. Cl. .......... 174/59; 439/312; 324/110; 324/142; 385/78
(58) Field of Classification Search ............... 174/59; 439/312; 324/110, 142; 385/78
See application file for complete search history.

(56) References Cited

U.S. PATENT DOCUMENTS

| | | | |
|---|---|---|---|
| 4,615,113 A | 10/1986 | Fennel | |
| 4,749,251 A | 6/1988 | Moulin | |
| 4,901,007 A | 2/1990 | Sworm | |
| 5,663,525 A * | 9/1997 | Newman | 174/50 |
| 7,223,129 B1 * | 5/2007 | Lopez et al. | 439/709 |
| 7,357,672 B2 * | 4/2008 | Montena | 439/584 |
| 7,614,148 B2 * | 11/2009 | Chamberlain | 29/854 |

FOREIGN PATENT DOCUMENTS
DE    10121253 A1    11/2002

OTHER PUBLICATIONS

Search Report and Written Opinion for PCT/US2007/004397 issued by the European Patent Office on Aug. 14, 2007.

* cited by examiner

*Primary Examiner* — Dhiru R Patel

(57) ABSTRACT

An energy distribution system (2) is provided having a metering box (6) having a housing portion (14) and a cover (16), the cover being lockable to the metering box. An energy meter (32) is provided in the metering box with a first connector (34) extending to a wall (20) of the metering box with a connectable portion of the connector extending through an opening (26). Incoming or outgoing cables to or from the power source can be connected to the connector (34), and the connectors (34,36) are lockable to each other where the disconnection of the connectors can only be made by opening the metering box cover (16) and disconnecting the connectors from the inside of the metering box.

20 Claims, 5 Drawing Sheets

ENERGY DISTRIBUTION SYSTEM

BACKGROUND OF THE INVENTION

The invention is directed to a connector system usable in a power distribution application.

It is well known in the connector industry to provide coaxial connectors of the type where a male coaxial connector is comprised of a conductive center conductor and a mateable female connector is provided with a central female conductor, which cooperates with the male conductor for electric conductivity. An outer conductor coaxially surrounds the central conductors of both the male and female connector to provide a neutral conductor. It is also known to provide coaxial cable where a central conductor is connected to either the male or female central conductor. The coaxial cable also has an outer conductor, which is electrically connectable to the outer conductor of the male or female connector. Obviously, connection between the male and female connector can be made by any type of latching arrangement, but it is common to have a screw type or bayonet style interconnection between the male and female connectors. It is also known that the connection between the male and female connectors will thereby provide continuity between the central and outer conductors of the connected coaxial cables.

One of the shortcomings in the market place exists in the energy distribution application, where cable of the above-described version is used to distribute AC energy even up to several hundred volts. The problem does not exist in the ability of the cable to handle that type of voltage distribution, but rather the cable is often tapped into for energy stealing. The cables are typically tapped into at a point of interconnection from the utility company. It would therefore be desirable to provide a solution to the above-mentioned shortcomings.

SUMMARY OF THE INVENTION

The objects have been accomplished by providing a power distribution system, comprising a metering box having an internal volume and a plurality of through openings extending through one or more walls of the metering box. The metering box further comprises at least one lockable cover portion. An energy meter is provided in the internal volume of the metering box. A first connector is positioned internal to the metering box and electrically connected to the energy meter, with a first connection interface provided at one of the plurality of through openings. A first mating connector is positioned external to the metering box and is electrically connectable to the first connector. The first connector and first mating connector are lockable together, and are disconnectable only through the internal volume of the metering box.

The power distribution system may further comprise a second connector positioned internal to the metering box and be electrically connected to the energy meter, with a second connection interface provided at another of said plurality of through openings. A second mating connector is positioned external to the metering box and is electrically connectable to the second connector. The second connector and the second mating connector are also lockable together, and are disconnectable only through the internal volume of the metering box.

DETAILED DESCRIPTION OF THE EMBODIMENTS

Figure 1:
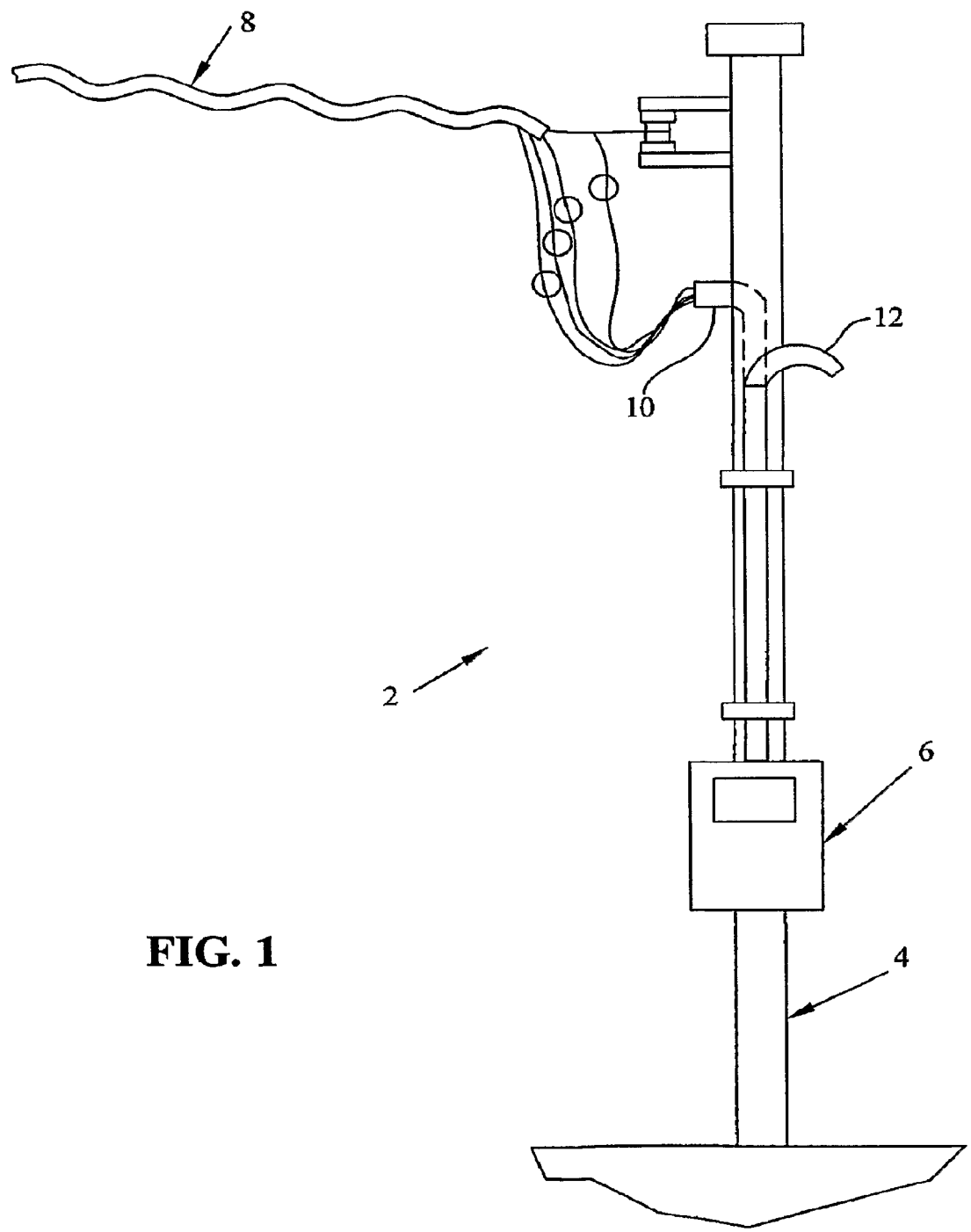
FIG. 1 is a front plan view of an energy distribution system showing an incoming cable to a drop wire on a utility pole and then to a metering box.

With reference first to FIG. 1, an energy distribution system is shown generally at 2 which is comprised of a utility pole 4, a metering box 6, and an electrical distribution cables 8. Cable 8 would include an incoming cable 10 and an outgoing cable 12 to one of the residences to receive the electrical cable for energy distribution.

Figure 2:
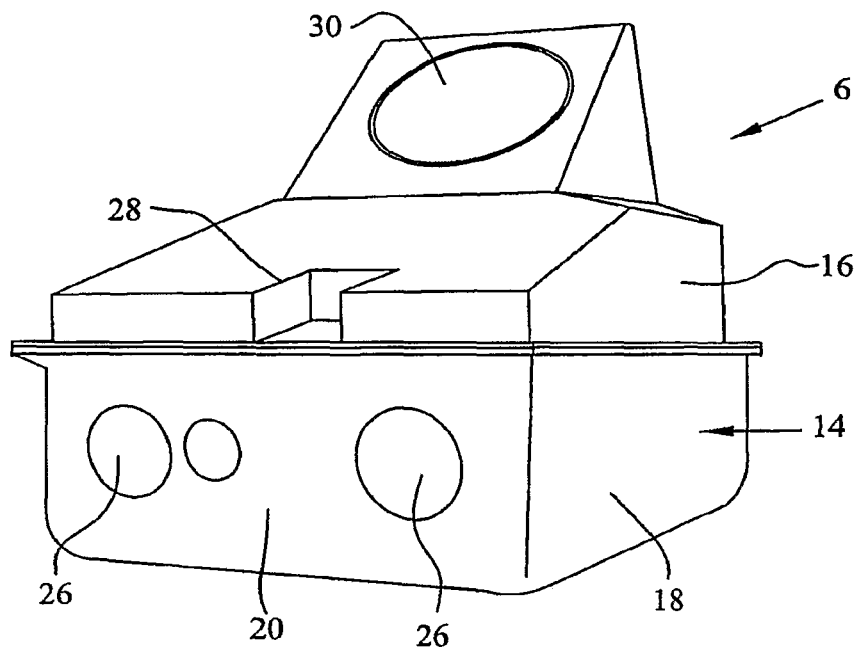
FIGS. 2 and 3 show perspective views of the metering box shown in FIG. 1.
Figure 3:
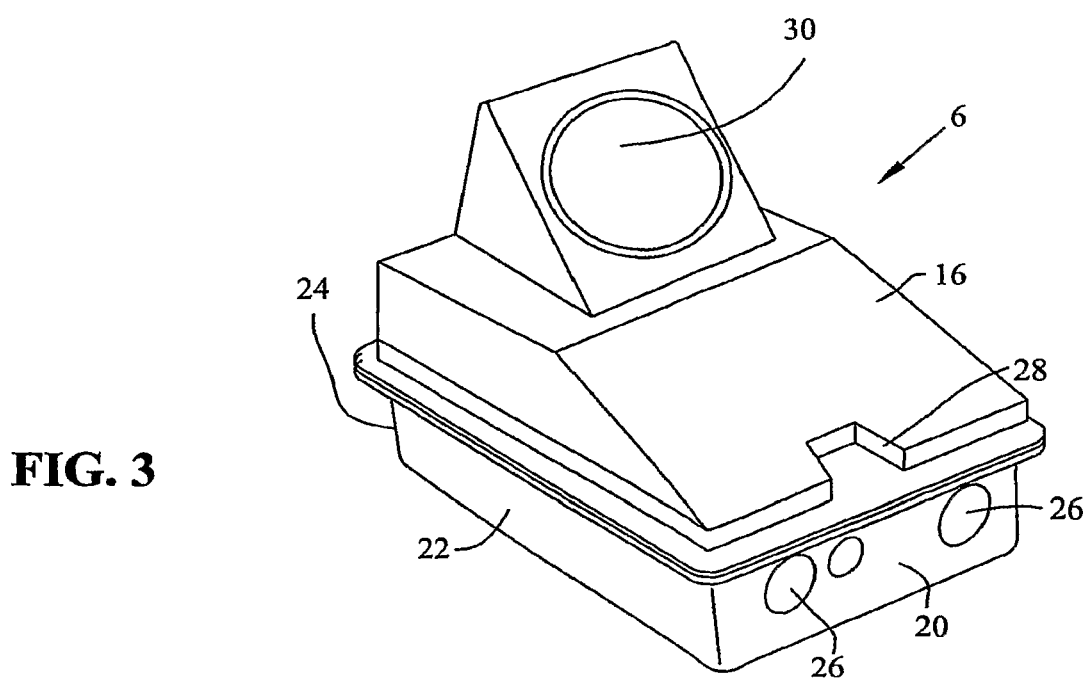

With reference now to FIGS. 2 and 3, metering box 6 is shown comprised of a lower housing portion 14 and a cover 16. Housing portion 14 is comprised of a plurality of walls 18, 20, 22 and 24, where at least some of the walls include through openings such as 26 in the form of knock-outs for positioning an incoming or outgoing cable there through. Metering box 6 would also include a cover 16 which is lockable to housing portion 14 for example by way of a keyed lock (not shown) in aperture 28, locking cover 16 to housing portion 14. As described herein, a meter would be positioned within an internal volume of the metering box whereby the meter could be read through magnifying window 30 of cover part 16.

Figure 4:
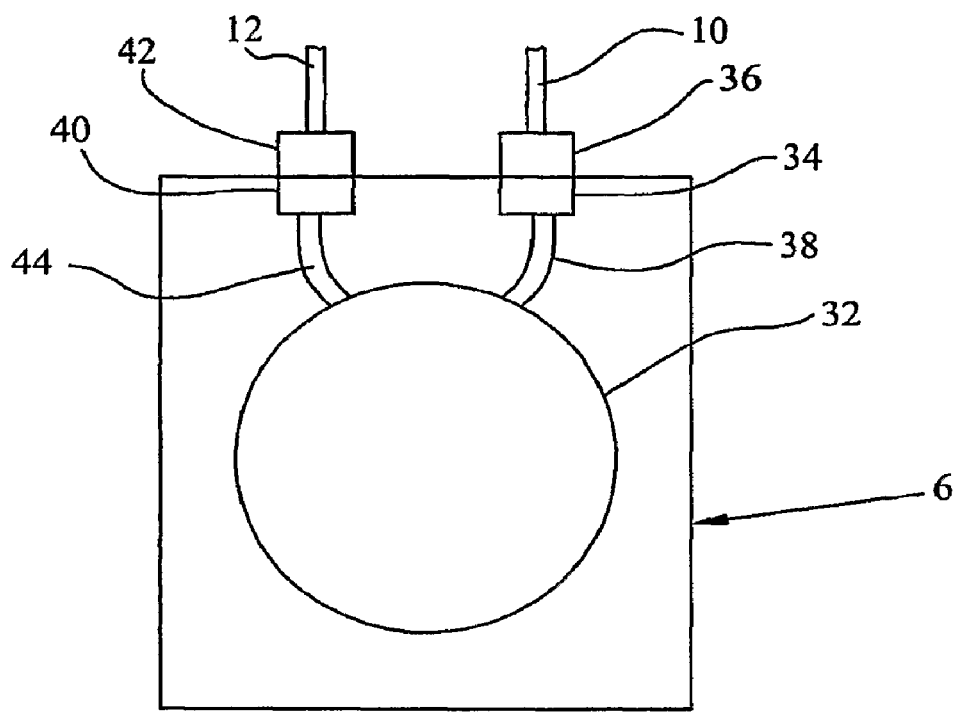
FIG. 4 shows a diagrammatical view of the metering box coupled with a meter.

With reference now to FIG. 4, the metering box is shown diagrammatically wired to a meter 32, where incoming cable 10 is connected to the meter 32 by way of a first connector 34 and a first mating connector 36. First connector 34 and a first mating connector 36 define a first connector assembly, where first connector 34 and first mating connector 36 are electrically connectable by way of contacts 60, 70. Connector 34 is connected to meter 32 by way of a cable portion 38.

Outgoing cable 12 may also be connected to a meter by of a connection system including a second connector 40 and a second mating connector 42 where the connection system is connected to meter 32 by way of a cable portion 44. Second connector 40 and second mating connector 42 define a second connector assembly, where second connector 40 and second mating connector 42 are electrically connectable by way of contacts that are similar to contacts 60, 70.

Figure 5:
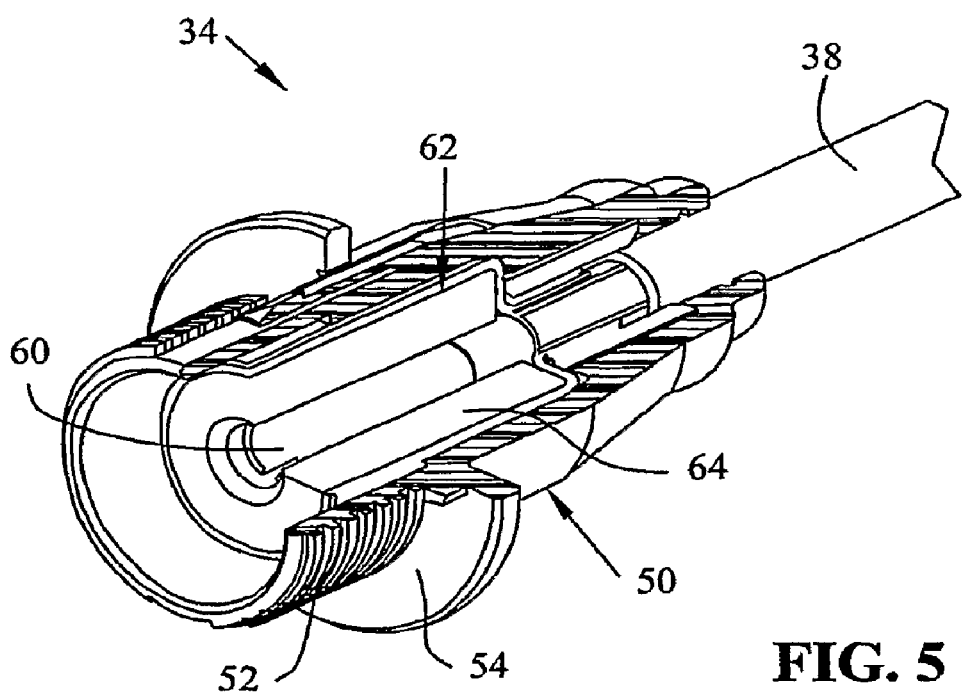
FIG. 5 shows a front perspective view of the male coaxial connector.

With reference now to FIG. 5, first connector 34 may be profiled as a male coaxial cable connector, comprised of a housing portion 50 having a front threaded portion 52 forward of a flange 54. Coaxial cable 38 is shown electrically connected to first connector 34 where a center conductor of cable 38 is interconnected to a central contact 60, and where an outer conductor of cable 38 is interconnected to outer contact 62 of connector 34, and is separated by an insulator 64.

Figure 6:
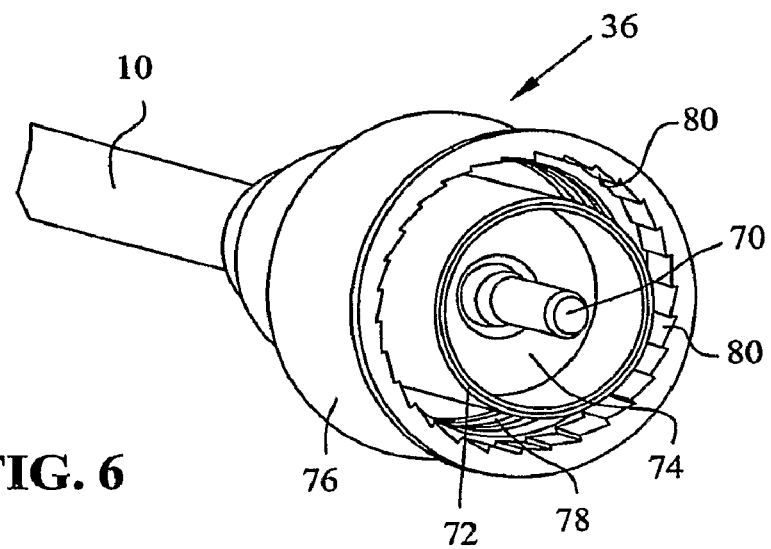
FIG. 6 shows a front perspective view of the female connector.
Figure 7:
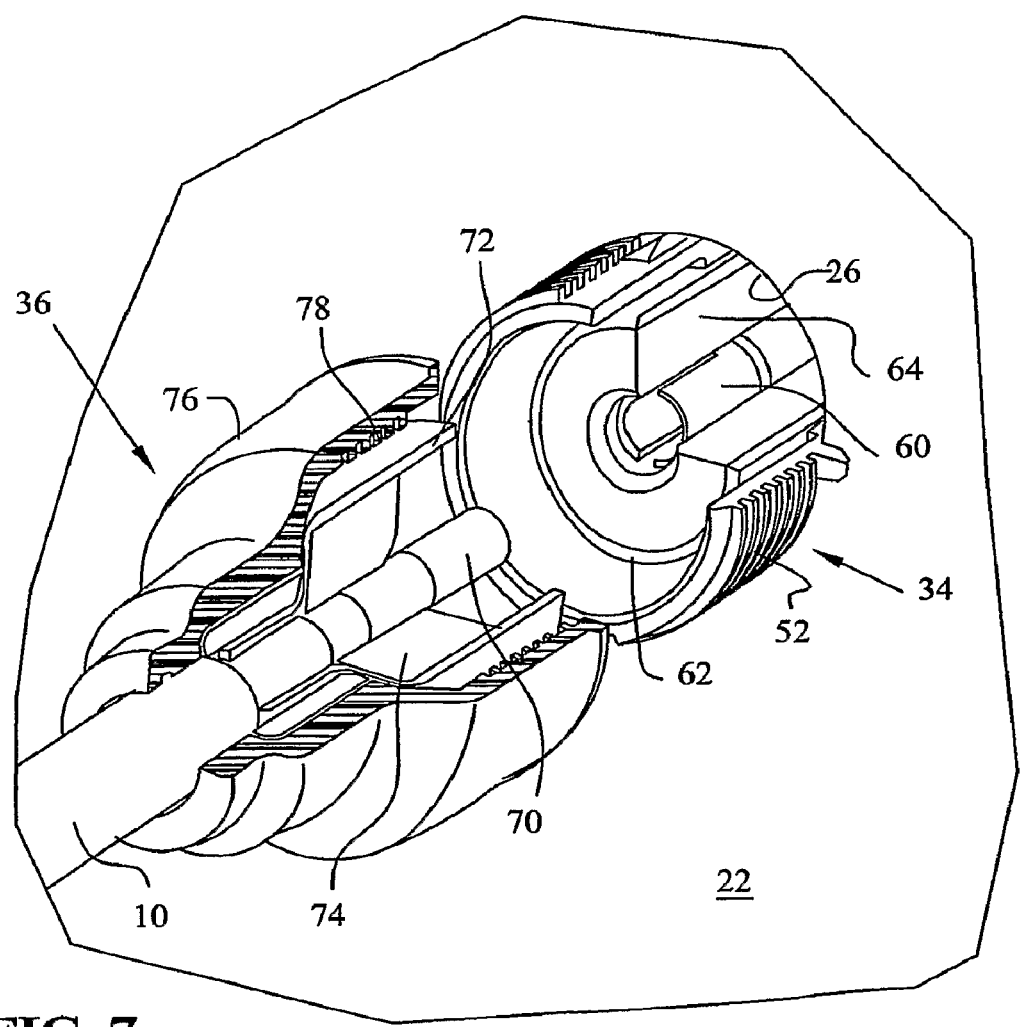
FIG. 7 shows an exploded view of the male and female connectors in partial cross section.
Figure 8:
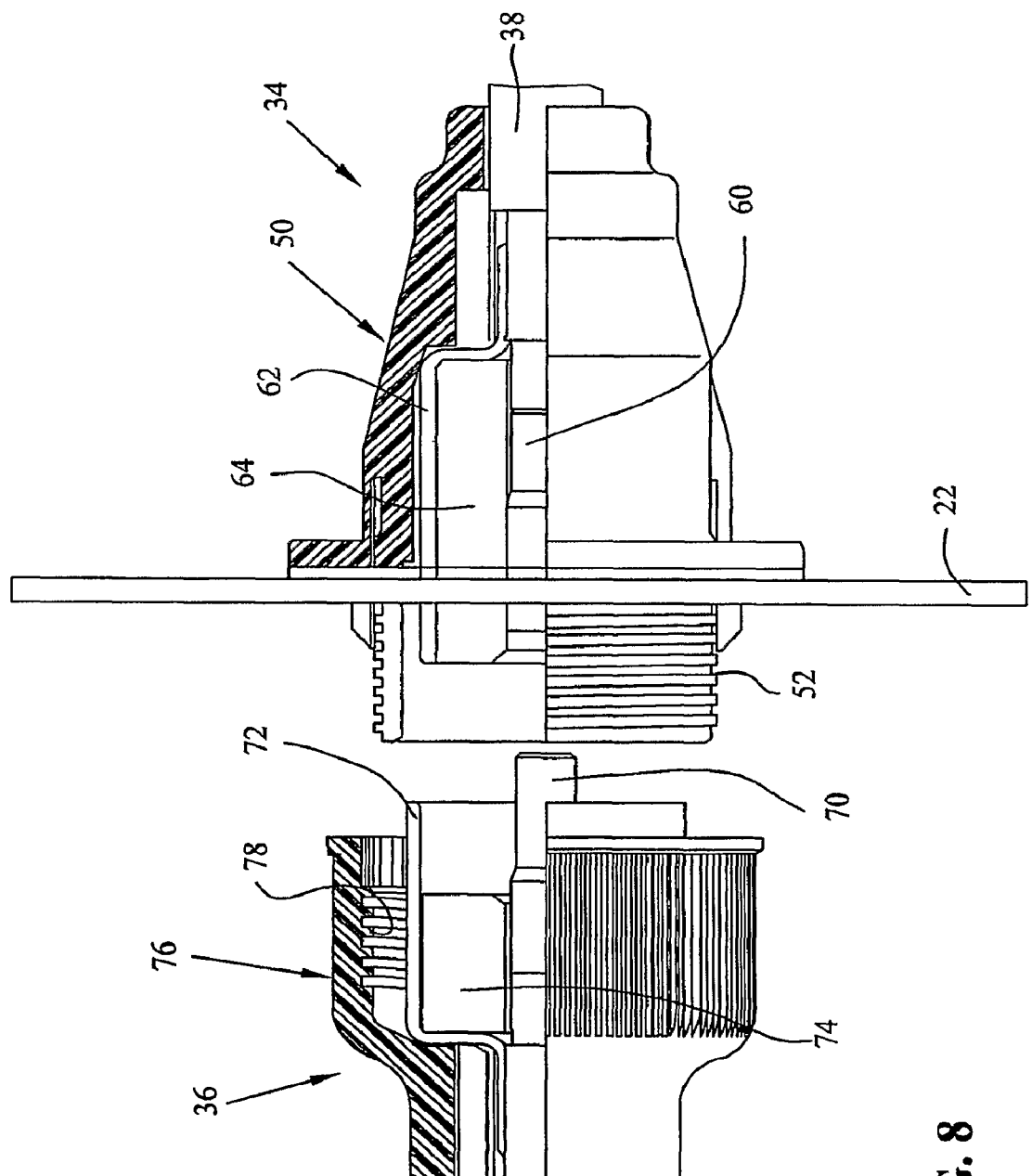
FIG. 8 shows a partial cross section through a connection system through the metering box.

With reference now to FIG. 6, first mating connector 36 is shown interconnected to incoming cable 10, whereby a center conductor of cable 10 is interconnected to center contactor pin 70 and where outer conductor of cable 10 is interconnected to outer conductor 72 of connector 36 spaced apart by an insulator 74. Outer housing 76 of mating connector 36 has an internal threaded portion 78 which is threadably connectable with threaded portion 52 of connector 34 (FIG. 5). This is best shown in FIGS. 7 and 8 where center contacts 60, 70 are poised for interconnection with each other, as well as outer conductors 62, 72. The portion of connector 34 protruding through wall 22 (see FIG. 7) defines a first connection interface provided at through opening 26. In a like manner, a portion of connector 40 protruding through wall 22 defines a second connection interface provided at through opening 26.

It is also anticipated that connectors 34 and 36 are lockably connected to each other, such that the disconnection can only be made after opening the cover 16 of meter box 6. While many different types of locking mechanisms could be envisioned, one type of locking system to lock the connectors 34, 36 together would include a plurality of ratchet teeth 80 (FIG. 6) positioned at the front end of housing 76 which would be locked into one or more locking pawls (not shown) on mating connector 50 or otherwise positioned adjacent to one of the apertures 26. In this manner, housing 76 (and connector 36) would be threadably connected to connector 34, whereby ratchet teeth 80 are locked into a locking connection with one or more pawls and the pawls would only be accessible by opening cover 16 and accessing the pawl through the metering box.

It should be appreciated that second connector 40 and second mating connector 42 could be identical to connectors 34, 36, or could be any other type of electrical connector.

In this manner, no electrical connection can be made to the metering box and to the connector portions 34, 36 or 40, 42 without opening the meter box and as the metering box is provided with a locking portion, where only authorized personnel having the key to the lock, can open the cover 16. Thus energy stealing is hereby thwarted

What is claimed is:

1. A power distribution system, comprising:
    a metering box having an internal volume and a plurality of through openings extending through one or more walls of said metering box, and said metering box further comprising at least one lockable cover enclosing the metering box;
    an energy meter provided in said internal volume of said metering box;
    a first connector positioned internal to said metering box and electrically connected to said energy meter, with a first connection interface provided at one of said plurality of through openings;
    a first mating connector positioned external to said metering box and electrically connectable to said first connector;
    said first connector and first mating connector being electrically connectable and lockable together, and being disconnectable only by accessing said internal volume of said metering box by opening said at least one lockable cover.

2. A power distribution system of claim 1, further comprising a second connector positioned internal to said metering box and electrically connected to said energy meter, with a second connection interface provided at another of said plurality of through openings, and a second mating connector positioned external to said metering box and electrically connectable to said second connector, said second connector and second mating connector being electrically connectable and lockable together, and being disconnectable only through said internal volume of said metering box.

3. A power distribution system of claim 1, wherein said first connector is comprised of a coaxial connector.

4. A power distribution system of claim 3, wherein said second connector is comprised of a coaxial connector.

5. A power distribution system of claim 3, wherein said first connector is comprised of a male coaxial connector.

6. A power distribution system of claim 5, wherein said first mating connector is comprised of a female coaxial connector.

7. A power distribution system of claim 6, wherein said first mating connector includes an internally threaded nut which mates with external threads on the first connector.

8. A power distribution system of claim 7, wherein said internally threaded nut of the first mating connector comprises a locking profile which locks to said first connector.

9. A power distribution system of claim 8, wherein said locking profile is comprised of ratchet teeth.

10. An energy distribution assembly, comprising:
    a metering box having an internal volume and a plurality of through openings extending through one or more walls of said metering box, and said metering box further comprising at least one lockable cover enclosing the metering box;
    an energy meter provided in said internal volume of said metering box;
    an incoming cable;
    an outgoing cable;
    a first connector assembly connecting said incoming cable and said energy meter;
    a second connector assembly connecting said outgoing cable and said energy meter; and
    one of said first or second connector assemblies being electrically connectable and lockable together, and being disconnectable only through said internal volume of said metering box upon opening said at least one lockable cover.

11. An energy distribution assembly of claim 10, wherein said first connector assembly is comprised of a first connector positioned internal to said metering box and electrically connected to said energy meter, with a first connection interface provided at one of said plurality of through openings and a first mating connector positioned external to said metering box and electrically connectable to said first connector.

12. An energy distribution system of claim 11, wherein said first connector is comprised of a coaxial connector.

13. An energy distribution system of claim 12, wherein said first mating connector is comprised of a coaxial connector.

14. An energy distribution system of claim 12, wherein said first connector is comprised of a male coaxial connector.

15. An energy distribution system of claim 14, wherein said first mating connector is comprised of a female coaxial connector.

16. An energy distribution system of claim 15, wherein said first mating connector includes an internally threaded nut which mates with external threads on the first connector.

17. An energy distribution system of claim 16, wherein said internally threaded nut of the second connector comprises a locking profile which locks to said first connector.

18. An energy distribution system of claim 17, wherein said locking profile is comprised of ratchet teeth.

19. An energy distribution system of claim 10, wherein said second connector assembly is comprised of a second connector positioned internal to said metering box and electrically connected to said energy meter, with a second connection interface provided at another of said plurality of through openings, and a second mating connector positioned external to said metering box and electrically connectable to said second connector.

20. An energy distribution system of claim 19, wherein said second connector and said second mating connector are complementary coaxial connectors.

* * * * *